United States Patent [19]

Masuda

[11] 4,069,430
[45] Jan. 17, 1978

[54] MIS SWITCHING CIRCUIT CAPABLE OF ENDURING HIGH VOLTAGE

[75] Inventor: Kenzo Masuda, Tokorozawa, Japan
[73] Assignee: Hitachi, Ltd., Japan
[21] Appl. No.: 700,745
[22] Filed: June 29, 1976
[30] Foreign Application Priority Data
  July 2, 1975  Japan ................................ 50-80891
[51] Int. Cl.² ................... H03K 17/60; H03K 19/40; H02H 9/00
[52] U.S. Cl. ................................ 307/270; 307/214; 307/251; 307/304; 361/58
[58] Field of Search ............... 307/205, 214, 215, 251, 307/304, 270, 296, 200 B; 330/207 P; 361/58; 323/9

[56] References Cited
U.S. PATENT DOCUMENTS 3,818,245  6/1974  Suzuki et al. ................... 307/270 X
3,867,646  2/1975  McCoy ............................ 307/251

FOREIGN PATENT DOCUMENTS 4,995,561  10/1974  Japan ............................... 307/205

OTHER PUBLICATIONS

Hanna et al., "Single-Supply Voltage Divider for Small Signal Loads;" IBM Tech. Discl. Bull.; vol. 17, No. 3, pp. 937-938; 8/1974.
Forbes et al., "FET High-Performance Circuit & Fabrication Technology;" IBM. Tech. Discl. Bull.; vol. 14, No. 11; pp. 3400-3401; 4/1972.

Primary Examiner—Larry N. Anagnos
Attorney, Agent, or Firm—Craig & Antonelli

[57] ABSTRACT

An MIS switching circuit capable of enduring a high voltage, comprises a switching FET, one or more protective FETs connected in series to the switching FET and a load connected between the drain of the protective FET and a high voltage source, wherein the load is constituted by a series connection of a plurality of FETs.

6 Claims, 4 Drawing Figures

MIS SWITCHING CIRCUIT CAPABLE OF ENDURING HIGH VOLTAGE

This invention relates to an MIS switching circuit capable of enduring a high voltage, incorporated in a semiconductor integrated circuit.

In general, the gate-drain voltage of an insulated-gate field-effect transistor (hereafter referred to as MISFET or simply FET) at which the drain junction breaks down, is as low as about 20V. The drive voltage for the display elements of an electronic desk computer is as high as 25 – 50V so that the display elements cannot be driven by an ordinary switching circuit using MISFETs.

Therefore, there has been proposed a switching circuit in which a switching FET is connected in series to a protective FET and in which the drain of the protective FET is connected through a load resistor to a voltage source while the source of the switching FET is connected to a common potential source. However, since the load resistor is externally connected to the semiconductor integrated circuit including the switching and the protective FETs, this switching circuit is not preferable from a viewpoint of reliability and reduction of the number of component parts.

The main object of this invention is to provide an MIS switching circuit capable of enduring a high voltage, having a high reliability and a high integration density.

According to this invention, the load for the switching FET is constituted by a plurality of series-connected FETs. The number of the series-connected FETs is preferably comparable, and especially equal, to the sum of the numbers of the switching and the protective FETs.

Other objects and advantages of this invention will be apparent from the following description of embodiments of this invention, taken in conjunction with the attached drawings, in which.

Figure 1:
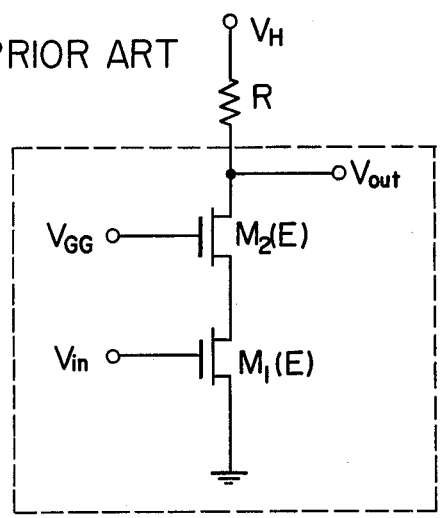
FIG. 1 shows an example of a conventional switching circuit.

First of all, the conventional switching circuit will be briefly described with the aid of FIG. 1.

As seen from FIG. 1, a switching circuit comprises a load resistor R connected to a voltage source $V_H$ and a switching FET $M_1$ and a protective FET $M_2$ connected in series with each other and arranged in an integrated circuit configuration. In FIG. 1, the enclosure by broken line indicates the integrated circuit configuration. With this structure, the high voltage $V_H$ is distributed across the series-connected FETs $M_1$ and $M_2$ as well as the load resistor R such that an output voltage of about 40V can be derived. However, the switching circuit shown in FIG. 1 is not preferable in view of the improvement in reliability and the requirement that the number of parts should be decreased, since the load resistor must be connected externally to the integrated circuit.

One method to solve this problem is to use an FET as the load. However, if an FET is used as such a load, there arise two other problems as follows. First, a heavy current flows through the FET as a load since a high voltage is applied between the gate and the source of the FET. Accordingly, to restrict the magnitude of current, the channel of the FET must be sufficiently long. Hence, the longer is the channel length, the smaller is the integration density. Secondly, since a high voltage is applied across the FET, there is a need for a means for protecting the FET from the high voltage.

Figure 2:
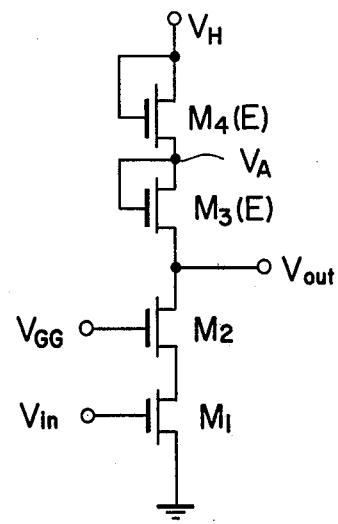
FIGS. 2 to 4 show switching circuits as preferred embodiments of this invention.

Now, an embodiment of this invention will be described with the aid of FIG. 2. As shown in FIG. 2, series-connected enhancement type FETs $M_3$ and $M_4$, each having its gate and drain short-circuited, form a load means. The drain of the FET $M_4$ is connected to a high voltage source $V_H$ and the source of the FET $M_3$ is connected to a series circuit of a protective FET $M_2$, to the gate of which a DC bias voltage $V_{GG}$ is applied, and a switching FET $M_1$ driven by an input signal $V_{in}$. The DC bias voltage $V_{GG}$ is provided for an IC into which the switching circuit is incorporated. An output voltage $V_{out}$ is taken at the junction point of the load means and the protective FET $M_2$.

With this structure, it is when the switching FET $M_1$ is rendered conductive by an input signal $V_{in}$ applied and therefore the drain potential of the protective FET $M_2$ is at the ground level (i.e., when the ground level is taken at the terminal $V_{out}$), that the withstand voltages of the FETs used as the load means play major roles. On such an occasion, the voltage $V_H$ of the source is divided in accordance with the ratio of the impedances of the FETs $M_3$ and $M_4$ and the divided voltages are distributed respectively across the FETs $M_2$ and $M_4$. Accordingly, if the impedances of the FETs $M_3$ and $M_4$ are designed to be nearly equal to each other, the potential $V_A$ at the junction point of the FETs $M_3$ and $M_4$ with respect to ground is roughly equal to $(\frac{1}{2})V_H$. Since the drive voltage for an ordinary display element is at most 40V. So, if $V_H \leq 40V$, then $V_A \leq 20V$. Consequently, the gate-source voltages of the FETs $M_3$ and $M_4$ are not higher than 20V so that the load FETs $M_3$ and $M_4$ can well endure the source voltage $V_H$.

Moreover, the load means described above as an embodiment of this invention, consisting of two series-connected enhancement type FETs, consumes less power than the load means formed of a single FET even when a higher source voltage is used. Namely, since, as is clear from the $V_{GS}$-$I_D$ characteristic of the MISFET, the drain current increases with an increase in the gate-source voltage and since the gate-source voltage can be decreased according to this embodiment, then the current can be effectively limited without any increase in the channel length. It is, therefore, clear that if the design is made on the basis of a predetermined load current, the total area occupied in IC by the two FETs used in combination as a load means according to this invention is still smaller than that occupied by a single FET serving as a conventional load means. This means that the integration density can be improved by this invention.

This invention is by no means limited to the embodiment described above, but can permit of various modifications within its spirit and scope.

Figure 3:
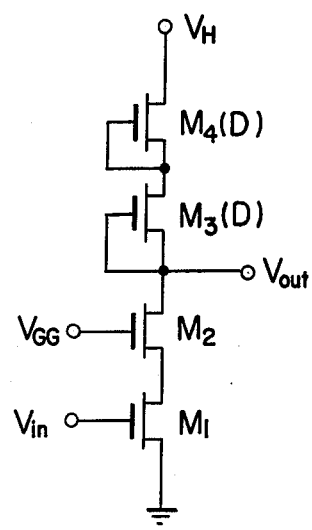

FIG. 3 shows a modification in which the load is constituted by two series-connected depletion type FETs $M_3$ and $M_4$, each having its gate and source short-circuited to each other.

Figure 4:
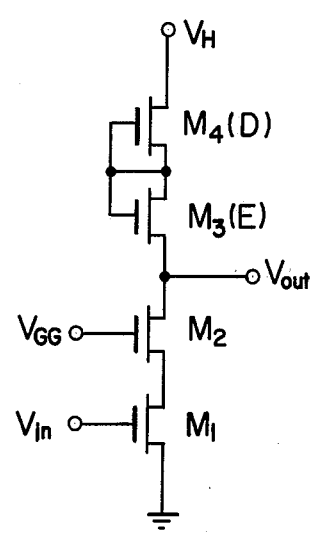

FIG. 4 shows another modification in which the load is constituted by an enhancement type FET $M_3$ with its gate and drain short-circuited to each other and a depletion type FET $M_4$ with its gate and source short-circuited to each other, these FETs being connected in series. The circuit configuration shown in FIG. 3 or FIG. 4, where the depletion type FET performs a constant-current operation, consumes a smaller power than the circuit shown in FIG. 2, with its load constituted of enhancement type FETs, if the corresponding elements to be compared with each other have the same area. In any case, the important thing is to connect the FETs in such a manner that the high voltage $V_H$ is divided by the load FETs particularly when the output voltage is at the earth level.

In the above embodiments, the load means are those to which a voltage roughly equal to 40V is applied, but it is needless to say that more than two FETs may be used in a circuit for enduring higher voltages. In that case, more than one protective FET must be used so that the total number of the switching FET and the protective FETs may be comparable to, and preferably equal, to the number of the load FETs.

It is also clear that each load FET in the above embodiments may have its gate connected to an independent bias source instead of being short-circuited to its source or drain.

Moreover, the same result will be obtained if this invention is applied to the case where a load means is constituted by the recently developed FETs having higher withstand voltages with their drains formed through a double diffusion process.

I claim:

1. An MIS switching circuit capable of enduring a high voltage, comprising a load, at least one protective FET having its drain connected to said load and its gate arranged for connection to a DC bias source, and a switching FET having its drain connected to the source of said protective FET and its source connected to a common potential source and its gate arranged for reception of an input signal to the switching circuit, wherein said load is constituted by a plurality of FETs connected in series with each other between a high voltage source and the drain of said protective FET, the output of the switching circuit being derived from the junction point between said load and said protective FET.

2. An MIS switching circuit according to claim 1, wherein the FETs constituting said load are enhancement type and have their gates connected to their individual drains.

3. An MIS switching circuit according to claim 1, wherein the FETs constituting said load are depletion-type and have their gates connected to their individual sources.

4. An MIS switching circuit according to claim 1, wherein some of the FETs constituting said load are enhancement type and have their gates connected to their individual drains and others of them are depletion type and have their gates connected to their individual sources.

5. An MIS switching circuit according to claim 1, wherein the number of the FETs constituting the load is comparable to the sum of the number of the protective FETs and the number of the switching FET.

6. An MIS switching circuit according to claim 1, wherein each of the FETs constituting said load is arranged to be biased by a separate individual bias source.

* * * * *